United States Patent
Hofmann et al.

(10) Patent No.: US 7,195,978 B2
(45) Date of Patent: Mar. 27, 2007

(54) METHOD FOR THE PRODUCTION OF A MEMORY CELL, MEMORY CELL AND MEMORY CELL ARRANGEMENT

(75) Inventors: Franz Hofmann, Munich (DE); Richard Johannes Luyken, Munich (DE); Michael Specht, Munich (DE)

(73) Assignee: Infineon Technologies AG (DE)

( * ) Notice: Subject to any disclaimer, the term of this patent is extended or adjusted under 35 U.S.C. 154(b) by 214 days.

(21) Appl. No.: 10/999,810

(22) Filed: Nov. 29, 2004

(65) Prior Publication Data

US 2005/0157583 A1  Jul. 21, 2005

Related U.S. Application Data

(63) Continuation of application No. PCT/DE03/01699, filed on May 26, 2003.

(30) Foreign Application Priority Data

May 27, 2002  (DE) .................. 102 23 505

(51) Int. Cl.
  *H01L 21/336* (2006.01)
  *H01L 29/788* (2006.01)
(52) U.S. Cl. .................... 438/264; 257/321
(58) Field of Classification Search ........ 257/315–321; 438/201, 259, 261–264
See application file for complete search history.

(56) References Cited

U.S. PATENT DOCUMENTS

| | | | |
|---|---|---|---|
| 5,306,935 A | 4/1994 | Esquivel et al. | |
| 5,446,299 A | 8/1995 | Acovic et al. | |
| 5,751,037 A | 5/1998 | Aozasa et al. | |
| 5,929,479 A | * | 7/1999 | Oyama ....................... 257/315 |
| 6,136,650 A | 10/2000 | Lee | |
| 6,252,275 B1 | 6/2001 | Aitken et al. | |
| 6,271,088 B1 | 8/2001 | Liu et al. | |

OTHER PUBLICATIONS

Lin, X. et al.; "Opposite Side Floating Gate SOI FLASH Memory Cell"; Proceedings 2000 IEEE Hong Kong Electron Device Meeting, pp. 12-15.

* cited by examiner

*Primary Examiner*—Calvin Lee
(74) *Attorney, Agent, or Firm*—Dickstein, Shapiro, LLP.

(57) ABSTRACT

Memory cell having an auxiliary substrate, on which a first gate insulating layer is formed, a floating gate formed on the first gate insulating layer, an electrically insulating layer formed on the floating gate, a memory gate electrode formed on the electrically insulating layer, a substrate fixed to the memory gate electrode, a second gate insulating layer formed on a part of a surface of the auxiliary substrate, which surface is uncovered by partially removing the auxiliary substrate, a read gate electrode formed on the second gate insulating layer, and two source/drain regions located essentially in a surface region of the remaining material of the auxiliary substrate that is free of the second gate insulating layer and the read gate electrode, a channel region located between the two source/drain regions, wherein the channel region at least partly laterally overlaps the floating gate and the read gate electrode.

18 Claims, 9 Drawing Sheets

METHOD FOR THE PRODUCTION OF A MEMORY CELL, MEMORY CELL AND MEMORY CELL ARRANGEMENT

CROSS-REFERENCE TO RELATED APPLICATION

This application is a continuation of International Patent Application Ser. No. PCT/DE03/01699, filed May 26, 2003, which published in German on Dec. 4, 2003 as WO 03/100841, and is incorporated herein by reference in its entirety.

FIELD OF THE INVENTION

The invention relates to a method for the production of a memory cell, a memory cell and a memory cell arrangement.

BACKGROUND OF THE INVENTION

In accordance with the prior art, a flash memory cell is programmed, erased and read with a common floating gate transistor.

Figure 1A:
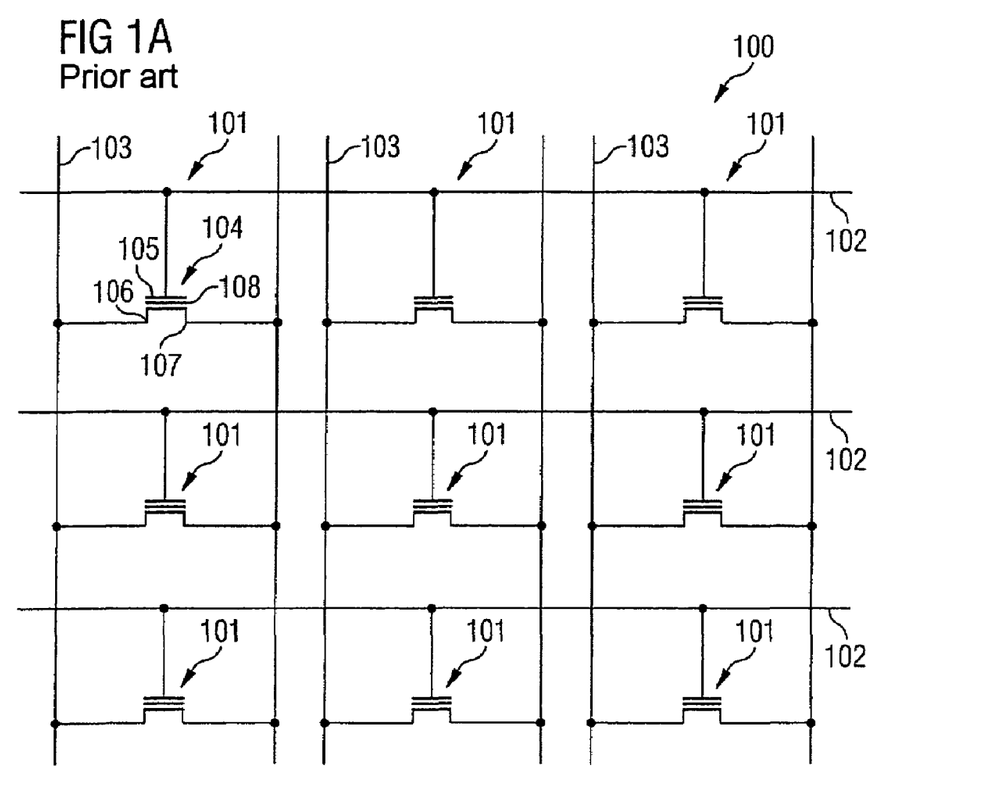
FIGS. 1A to 1E show memory cell arrangements in accordance with the prior art.

FIG. 1A shows a memory cell arrangement 100 in AND logic combination as known from the prior art.

This arrangement has a multiplicity of memory cells 101 which are arranged in matrix form and are in each case arranged in a crossover region of a word line 102 and a bit line 103 running orthogonally with respect thereto. Each memory cell 101 has a floating gate transistor 104, the gate terminal 105 of which is coupled to one of the word lines 102. A first source/drain terminal 106 and a second source/drain terminal 107 of the transistor 104 are coupled to a bit line 103. Electrical charge carriers can be introduced and permanently stored in a floating gate layer 108, the stored information clearly being coded in the charge state of the floating gate layer.

A memory cell 101 is programmed by electrical charge carriers being introduced by means of Fowler-Nordheim tunneling into the floating gate layer 108 of the memory cell 102. In order to erase the memory content of a memory cell 101, a voltage of 5 volts is applied to both source/drain terminals 106, 107, whereas a voltage of −12 volts is applied to the gate terminal 105. In order to program information, the gate terminal 105 is brought to an electrical potential of 17 volts, whereas the two source/drain terminals 106, 107 are at an electrical potential of 0 volts. In order to read out the information stored in a memory cell 101, a voltage of 0 volts is applied to the first source/drain terminal 106, a voltage of 1 volt is applied to the second source/drain terminal 107 and a voltage of 2.5 volts is applied to the gate terminal 105. In accordance with the charge state of the floating gate layer 108, which characteristically influences the conductivity of the channel region of the floating gate transistor 104, an electrical signal is detected during read-out of a memory cell 101 on the associated bit line 103, the value of which signal is characteristic of the charge state of the floating gate layer 108.

Figure 1B:
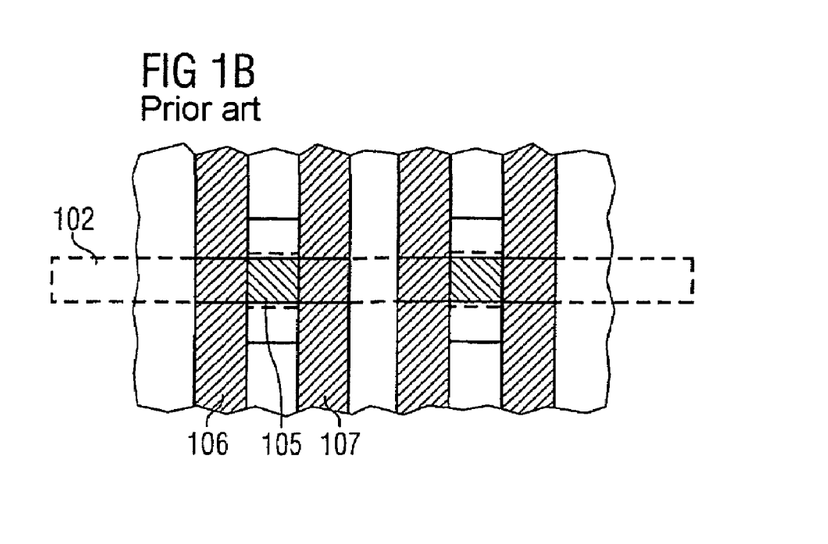

FIG. 1B shows a schematic plan view of a part of the circuit arrangement 100.

Figure 1C:
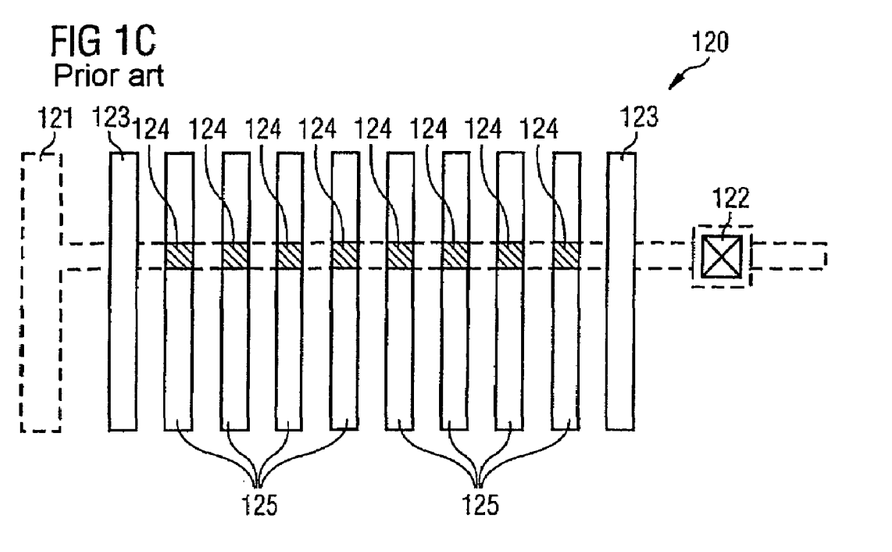

Further, FIG. 1C schematically illustrates a memory cell arrangement 120 (NAND arrangement) as known from the prior art.

A common first source/drain terminal 121 and a common second source/drain terminal 122 are provided in the case of the memory cell arrangement 120. The memory cell arrangement 120 can be activated by means of two selection transistors 123. Information can be stored in each of the memory transistors 124 using a floating gate layer. The memory transistors 124 can be driven via gate lines 125.

Figure 1D:
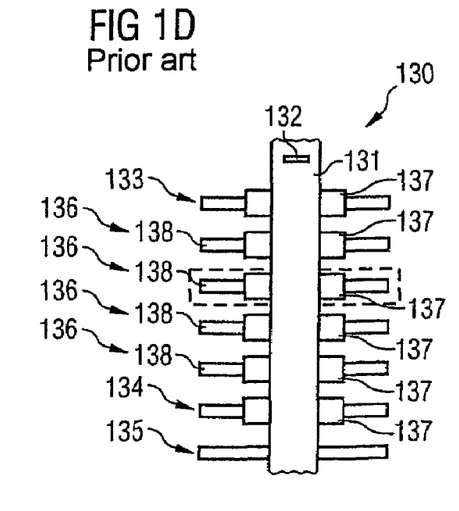

FIG. 1D illustrates a schematic plan view of a memory cell arrangement 130 known from the prior art.

The memory cell arrangement 130 (NAND arrangement like FIG. 1C) has a bit line 131 with a bit line contact 132. A first selection line 133 and a second selection line 134 are furthermore shown. Moreover, a common source/drain terminal line 135 is shown. A multiplicity of memory cells 136 arranged parallel to one another are shown between selection lines 133 and 134. Each of the memory cells 136 has a floating gate region 137. Word lines 138 arranged in a manner running orthogonally with respect to the bit line 131 are furthermore shown.

Figure 1E:
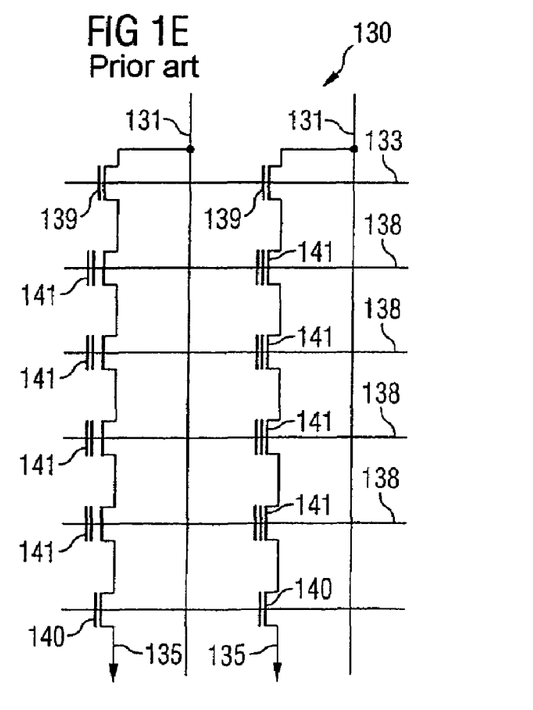

FIG. 1E shows a circuit diagram view of the memory cell arrangement 130.

In particular, the selection transistors 139, 140 of the first selection line 133 and of the second selection line 134, respectively, are shown here. Floating gate transistors 141 of the memory cells 136 are furthermore shown.

To summarize, it should be emphasized that, in the case of the memory cell arrangements in accordance with the prior art as described with reference to FIG. 1A to FIG. 1E, the word line is arranged in a manner running orthogonally with respect to the bit line and for each memory cell a common transistor in each case is used for programming, erasing and reading.

However, in the case of memory cells of this type, there are problems with the transistors in the context of advancing miniaturization since the thickness of the gate insulating layer between floating gate and the channel region of a memory transistor cannot be reduced significantly below approximately 8 nm. The reason for this is that a sufficiently long retention time is necessary for storing the data stored in a floating gate transistor. The stored data are lost on account of electric creepage currents with a time constant that is often referred to as the retention time. The retention time is shorter the thinner a gate insulating layer is chosen to be.

In many cases it is not possible to miniaturize such a transistor whilst keeping the thickness of the gate insulating layer constant. In the case of such a transistor, the so-called "subthreshold slope", that is to say clearly the dependence of the value of the drain current on a gate-source voltage below the threshold voltage, often becomes increasingly worse and the value of the electric current in the off state of the transistor becomes larger and larger.

Lin, X, Chan, M, Wang, H (2000) "Opposite Side Floating Gate SOI FLASH Memory Cell" Proceedings 2000 IEEE Hong Kong Electron Device Meeting, pages 12 to 15, illustrates the functioning of a flash memory cell with a read transistor provided separately from the memory transistor in a simulation study. In the case of the memory cell known from Lin et al., the electrical conductivity of the channel region is influenced by a floating gate on one side of said channel region and by a read gate on the other side of said channel region.

In order to produce such a memory cell, Lin et al. proposes patterning the silicon covering layer of an SOI substrate to form a read gate region, forming an electrically insulating layer thereon and epitaxially growing silicon material on said electrically insulating layer from the side using a laterally formed silicon seed region. However, with this growth method, a silicon layer with a sufficient quality cannot be achieved or can only be achieved with a very high outlay. On the layer sequence obtained in this way, a multiplicity of layers are deposited and patterned jointly, with the result that a flash memory cell with an extreme topology, i.e. surface structure is obtained which raises major problems in lithography particularly in a technology having feature sizes of less than 100 nm. Moreover, the production method presented in Lin et al. provides a tunnel layer made of silicon dioxide, which may possibly be destroyed under the action of the high programming voltages required for programming a memory cell of this type.

U.S. Pat. No. 6,252,275 B1 discloses a nonvolatile RAM memory cell based on a silicon-on-insulator technology.

U.S. Pat. No. 6,271,088 B1 discloses a method for the production of a buried memory cell with a vertically divided gate.

U.S. Pat. No. 5,306,935 discloses a method for forming a nonvolatile stacked memory.

U.S. Pat. No. 6,136,650 discloses a method for forming a three-dimensional flash memory structure.

SUMMARY OF THE INVENTION

The invention is based on the problem of providing a floating gate memory cell which can be produced with a reduced outlay and which has an electrically and mechanically The invention provides a method for the production of a memory cell, in which a first gate insulating layer is formed on an auxiliary substrate. Furthermore, a floating gate is formed on the first gate insulating layer. An electrically insulating layer is formed on the floating gate. A memory gate electrode is formed on the electrically insulating layer. A substrate is fixed to the memory gate electrode. The auxiliary substrate is partly removed, and a second gate insulating layer is formed on a part of an uncovered surface of the auxiliary substrate. A read gate electrode is formed on the second gate insulating layer. In an uncovered surface region of the remaining material of the auxiliary substrate, two source/drain regions are formed, a channel region is formed between the two source/drain regions in such a way that the channel region at least partly laterally overlaps the floating gate and the read gate electrode.

Furthermore, the invention provides a memory cell having an auxiliary substrate, on which a first gate insulating layer is formed. Furthermore, the memory cell has a floating gate on the first gate insulating layer and an electrically insulating layer on the floating gate. A memory gate electrode is formed on the electrically insulating layer. The memory cell according to the invention furthermore has a substrate, which is fixed to the memory gate electrode. A second gate insulating layer is arranged on a part of a surface of the auxiliary substrate, which surface is uncovered by means of partial removal of the auxiliary substrate. A read gate electrode is arranged on the second gate insulating layer. Two source/drain regions are formed essentially in a surface region of the remaining material of the auxiliary substrate that is free of the second gate insulating layer and the read gate electrode, a channel region located between the two source/drain regions, wherein the channel region at least partly laterally overlaps the floating gate and the read gate electrode.

Furthermore the invention provides a memory cell arrangement having a plurality of memory cells with the abovementioned features formed in and/or on the substrate.

A basic idea of the invention is to be seen in the fact that a floating gate memory cell is provided in double gate transistor architecture, the conductivity of a channel region being controlled by means of a read electrode near one of its interfaces and by means of a floating gate, which can be occupied by electrical charge carriers, near another interface opposite thereto. In other words, a read transistor is provided separately from a memory transistor. In the case of the memory cell according to the invention and the production method according to the invention, use is made in this case of two substrates (substrate, auxiliary substrate) which are fixed to one another, in particular by means of wafer bonding. Firstly, a surface region of the auxiliary substrate is processed, and the processed surface region of the auxiliary substrate is coupled to the substrate by means of wafer bonding. After the removal of material from the surface of the auxiliary substrate, an uncovered surface region of the auxiliary substrate can be processed. Clearly, it is possible to form an integrated circuit by processing it separately on the front side and rear side. A method of producing the memory cell according to the invention with good mechanical and electrical properties is created as a result, the method not being very complicated. The problems known from Lin et al. for producing a memory cell are avoided using the wafer bonding method.

In the case of a planar double gate transistor with a very thin silicon layer having the source/drain regions and a channel region arranged laterally in between, the transistor properties are determined by both gates. The silicon covering layer of an SOI wafer (silicon-on-insulator) is preferably used as the thin silicon substrate. The thin silicon layer of the SOI substrate is preferably fully depleted of charge carriers, which results in a high on current.

If the two gate terminals can be driven separately from one another, the electrical conductivity of the channel region can be influenced from both sides. The flash memory cell according to the invention is operated by means of two transistors. Arranged on one side of the channel region is a floating gate transistor, which can be driven via a memory gate electrode and the first gate insulating layer of which can be made thick enough to ensure storage of the information (electrical charge carriers) contained in the floating gate for a sufficiently long retention time. Provided on the other side of the channel region is a read transistor having a second gate insulating layer, which can be formed as a high-k dielectric in accordance with the production method according to the invention. The second gate insulating layer may be produced from a temperature-sensitive high-k material since the temperature-intensive method steps (primarily formation of the first gate insulating layer preferably as silicon dioxide) are already carried out during the formation of the second gate insulating layer. The threshold voltage of the transistor can be influenced by means of the electrical potential of the floating gate, so that the charge state of the floating gate can be read out by detecting an alteration of the threshold voltage of the transistor.

Preferably, a silicon-on-insulator substrate is used as the auxiliary substrate.

The substrate may be fixed to the memory gate electrode of the auxiliary substrate by means of wafer bonding. As an alternative, the substrate may also be formed on a different layer (e.g. an electrically insulating layer) that is optionally formed on the memory gate electrode.

In accordance with the method according to the invention, chronologically before the fixing of the substrate to the memory gate electrode, another electrically insulating layer may be formed between the memory gate electrode and the substrate.

The electrically insulating layer and the other electrically insulating layer may be produced from the same material, e.g. from silicon dioxide.

Chronologically after the formation of the memory cell, a logic circuit may be formed.

Silicon material fully depleted of charge carriers may be used as the channel region.

The thickness of the first gate insulating layer is preferably made greater than the thickness of the second gate insulating layer.

Refinements of the memory cell according to the invention are described in more detail below. Refinements of the memory cell also apply to the method for the production of a memory cell, and vice versa.

The substrate may be fixed to the layers arranged thereabove by means of wafer bonding.

The memory gate electrode and the read gate electrode may be arranged in a manner essentially running parallel to one another.

The source/drain regions may be formed such that they reach at least partly topologically right into the plane of the read gate electrode (in particular "elevated source/drain").

The second gate insulating layer may be produced from a high-k material, i.e. from a material having a sufficiently high dielectric constant, in particular from one or a combination of the materials aluminum oxide ($Al_2O_3$), silicon nitride ($Si_3N_4$), zirconium oxide ($ZrO_2$), hafnium oxide ($HfO_2$), yttrium oxide ($Y_2O_3$) and lanthanum oxide ($La_2O_3$). In particular, it is also possible to use an aluminate, i.e. a material mixture comprising aluminum oxide and at least one further component, preferably one of the materials mentioned.

The read gate electrode may be produced from a metallically conductive material, in particular from a metal. The read gate electrode may be produced from one or a combination of the materials tungsten (W), titanium (Ti), titanium nitride (TiN), tantalum nitride (TaN), copper (Cu) and aluminum (Al).

The memory cell arrangement having memory cells according to the invention is described in more detail below. Refinements of the memory cell also apply to the memory cell arrangement having memory cells.

The memory cell arrangement may preferably be connected up in AND logic combination or in NAND logic combination.

To summarize, it should be emphasized that the memory cell (flash memory cell) according to the invention is divided into a read transistor for reading out information stored in the memory cell and into a memory transistor for introducing or removing electrical charge carriers into a floating gate. Since the flash cell according to the invention is formed in double gate architecture, the electrical conductivity of one and the same channel region can clearly be influenced from two opposite sides by means of the read transistor and the memory transistor, respectively. By forming the first gate insulating layer and the second gate insulating layer sequentially and independently of one another, it is possible to realize the requirement of sufficiently secure storage of electrical charge carriers in the floating gate for a sufficiently long retention time by means of using a sufficiently thick first gate insulating layer and simultaneously to make the second gate insulating layer thin enough to enable a high read current. Furthermore, scaling of the read transistor is possible.

In contrast to the production method described in Lin et al., the method according to the invention for the production of a memory cell, by means of wafer bonding, is cost-effective and not very complicated and results in a memory cell with good electrical and mechanical properties. The memory cell according to the invention has small height differences, i.e. is essentially planar and has a low topology. A good capacitive decoupling between memory gate electrode and read gate electrode is furthermore realized. By virtue of the fact that the formation of the different gate insulating layers is well separated from one another in the process sequence (i.e. the first and second gate insulating layers can be formed independently of one another), both gate insulating layers can be optimized with regard to their respectively desired properties. Furthermore, the invention makes it possible firstly to carry out the temperature-intensive method steps (e.g. formation of an ONO layer, formation of the first gate insulating layer made of silicon dioxide) and subsequently to carry out the non-temperature-sensitive method steps (for example formation of a second gate insulating layer made of high-k material). The non-temperature-sensitive steps are therefore preferably carried out after the temperature-intensive method steps since temperature-sensitive structures can be adversely influenced under the influence of a high temperature and are protected against being adversely influenced by means of the chronological prejudice of the temperature-intensive steps. Furthermore, the invention enables a modular process sequence of production steps of the flash circuit (e.g. high-voltage transistors for programming and erasing) and production steps of the logic circuit.

BRIEF DESCRIPTION OF THE DRAWINGS

Exemplary embodiments of the invention are illustrated in the figures and are explained in more detail below.

DETAILED DESCRIPTION OF PREFERRED EMBODIMENTS OF THE INVENTION

A description is given below, with reference to FIG. 2A to FIG. 2I, of a method for the production of a memory cell in accordance with a preferred exemplary embodiment of the invention.

Figure 2A:
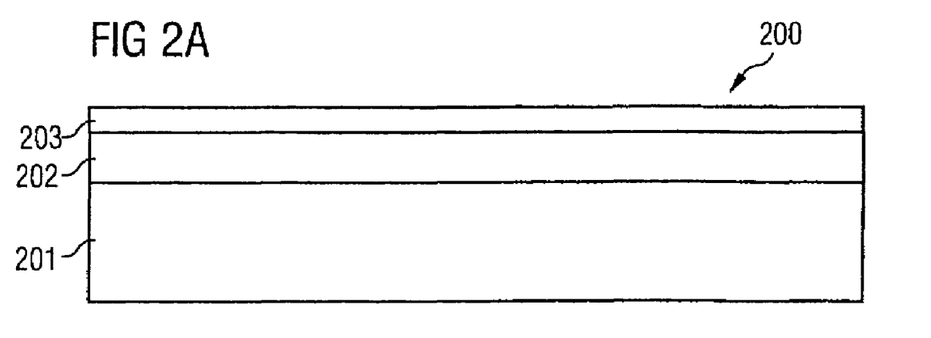
FIGS. 2A to 2I show layer sequences at different points in time during a method for the production of a memory cell in accordance with a preferred exemplary embodiment of the invention.

As shown in FIG. 2A, the starting material used is an SOI wafer 200 (silicon-on-insulator) having a silicon substrate 201, a silicon dioxide layer 202 formed thereon and a silicon layer 203 formed on the silicon dioxide layer 202. The silicon layer 203 has a thickness of preferably 40 nm or less. The surface of the SOI wafer 200 is planar.

Figure 2B:
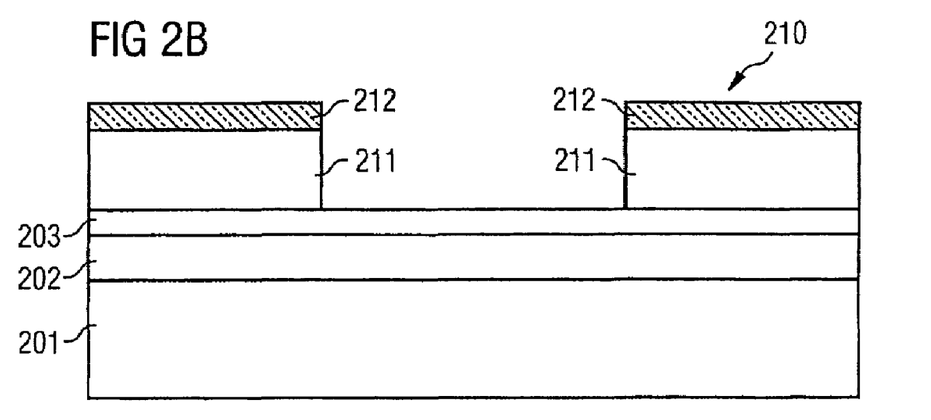

In order to obtain the layer sequence 210 shown in FIG. 2B, another silicon dioxide layer is deposited on the silicon layer 203 and a silicon nitride layer is deposited on the other silicon dioxide layer. On the layer sequence thus obtained, a photoresist layer is applied and patterned using a lithography method. In a further method step, the other silicon dioxide layer and the silicon nitride layer are patterned using an RIE method ("reactive ion etching") in such a way that the silicon dioxide structure 211 shown in FIG. 2B and a silicon nitride structure 212 arranged thereon are formed.

Figure 2C:
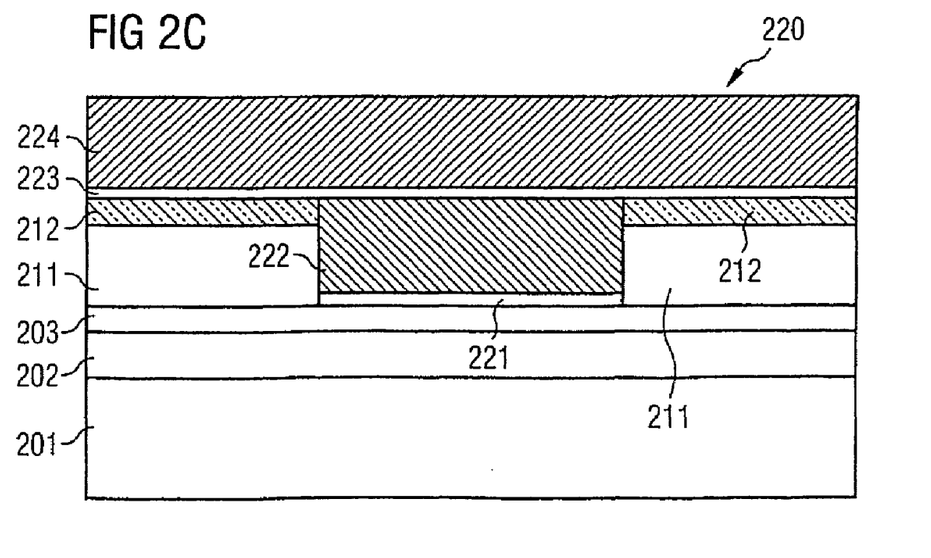

In order to obtain the layer sequence 220 shown in FIG. 2C, firstly a first gate insulating layer 221 made of silicon dioxide is formed by means of thermal oxidation of the surface material of the silicon layer 203. Furthermore, doped polysilicon material is deposited on the layer sequence obtained. The surface is planarized using a CMP method ("chemical mechanical polishing"). The remaining polysilicon material forms a floating gate 222 on the first gate insulating layer 221. In a next method step, an ONO layer sequence 223 comprising a silicon nitride layer between two silicon dioxide layers is deposited on the surface of the layer sequence. In a further method step, doped polysilicon material is deposited on the layer sequence thus obtained. A memory gate electrode 224 made of polysilicon is formed by means of patterning said polysilicon material in a plane containing the polysilicon material perpendicular to the paper plane of FIG. 2C using a lithography and an etching method.

Figure 2D:
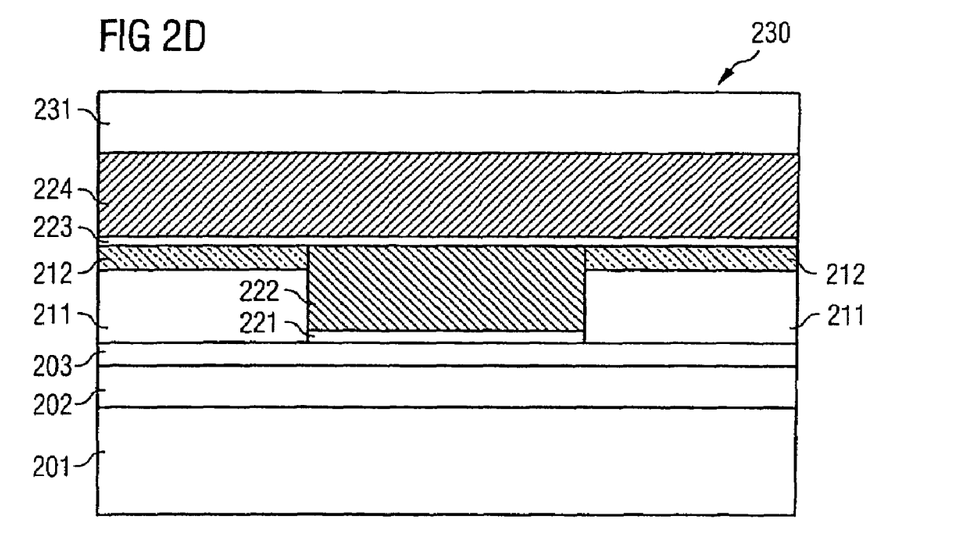

In order to obtain the layer sequence 230 shown in FIG. 2D, silicon dioxide material is deposited on the surface of the layer sequence 220 and the surface of the layer sequence 230 is planarized using a CMP method.

Figure 2E:
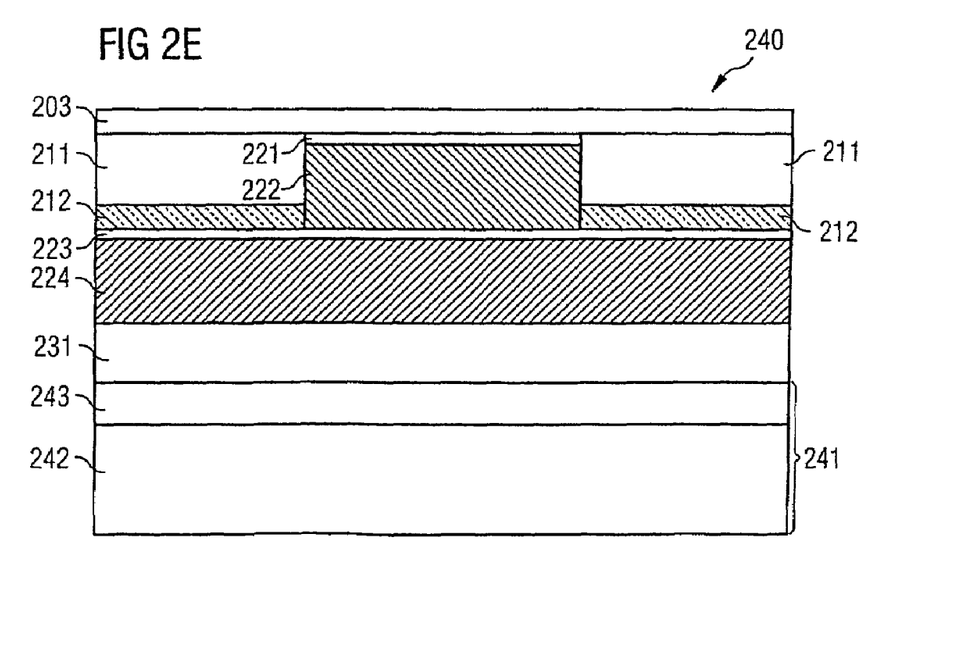

In order to obtain the layer sequence 240 shown in FIG. 2E, a carrier wafer 241 comprising a silicon substrate 242 and a silicon dioxide layer 243 formed thereon is fixed to the surface of the layer sequence 230. For this purpose, the surface of the silicon dioxide layer 243 of the carrier substrate is fixed to the surface of the silicon dioxide layer 231 of the layer sequence 230 using a wafer bonding method. The silicon substrate 201 and the silicon dioxide layer 202 are then removed using an etching method.

Figure 2F:
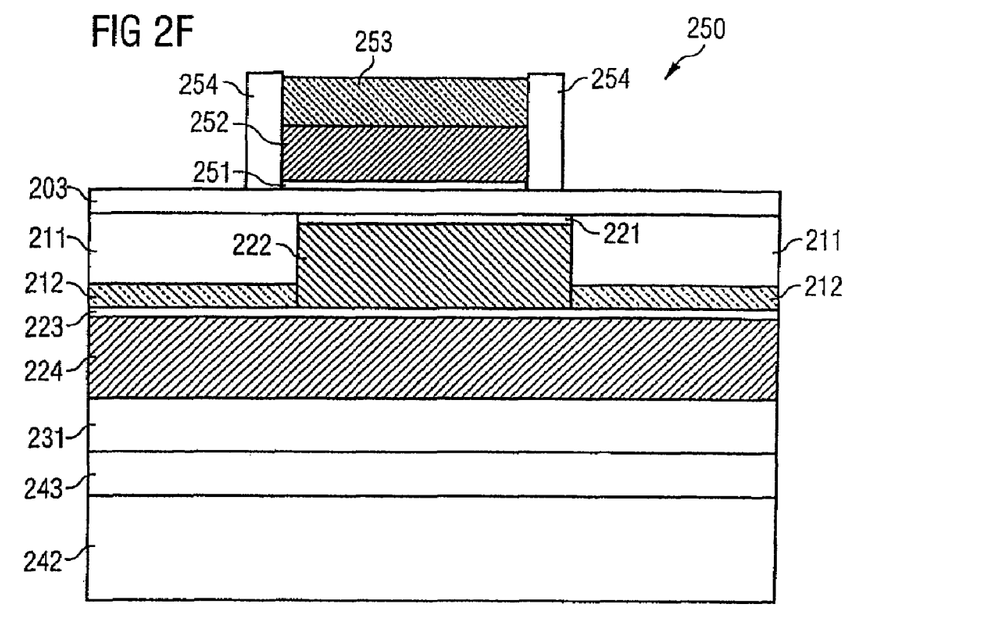

In order to obtain the layer sequence 250 shown in FIG. 2F, a second gate insulating layer 251 made of aluminum oxide ($Al_2O_3$) is deposited on a surface region of the silicon layer 203. Aluminum oxide is a high-k dielectric, which is advantageous for the functionality of the second gate insulating layer 251. By virtue of the fact that the required high-temperature processes (formation of the ONO layer 223, the first gate insulating silicon dioxide layer 221, etc.) have already been carried out, the temperature-sensitive aluminum oxide layer 251 is protected against being destroyed on account of subsequent high-temperature processes. It should furthermore be noted that the vertical thickness of the second gate insulating layer 251 in accordance with FIG. 2F is smaller than that of the first gate insulating layer 221. In a further method step, doped polysilicon material is deposited on the second gate insulating layer 251. Afterward, silicon nitride material is deposited on the polysilicon material. The polysilicon material and also the silicon nitride material are subsequently patterned using a lithography and an etching method to form a laterally delimited layer sequence, thereby forming a read gate electrode 252 made of polysilicon and a silicon nitride covering layer 253. Furthermore, silicon dioxide material is deposited on the layer sequence thus obtained and is etched back in such a way that silicon dioxide sidewalls 254 remain as a lateral boundary on both sides of the laterally delimited layer sequence comprising read electrode 252 and silicon nitride layer 253.

Figure 2G:
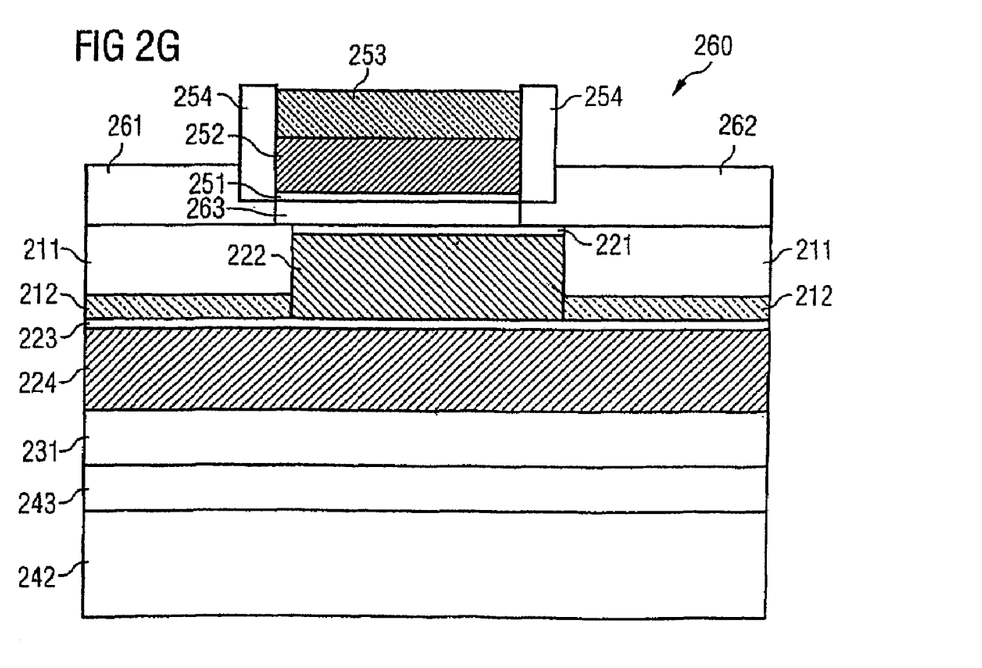

In order to obtain the layer sequence 260 shown in FIG. 2G, further silicon material is grown epitaxially on the uncovered silicon surfaces of the silicon layer 203 using a selective epitaxy method. As a result, the silicon material is reinforced topologically right into the plane of the read gate electrode 252. In a subsequent method step, using an ion implantation method, implantation ions of the n conductive type (for example arsenic) are implanted essentially into a surface region of the layer sequence that is free of the laterally delimited layer sequence comprising the components 252, 253, 254, thereby forming a first source/drain region 261 and a second source/drain region 262 which are in each case realized as an "elevated source/drain". The essentially undoped material of the silicon layer 103 remaining between the source/drain regions 261, 262 forms a channel region 263.

Figure 2H:
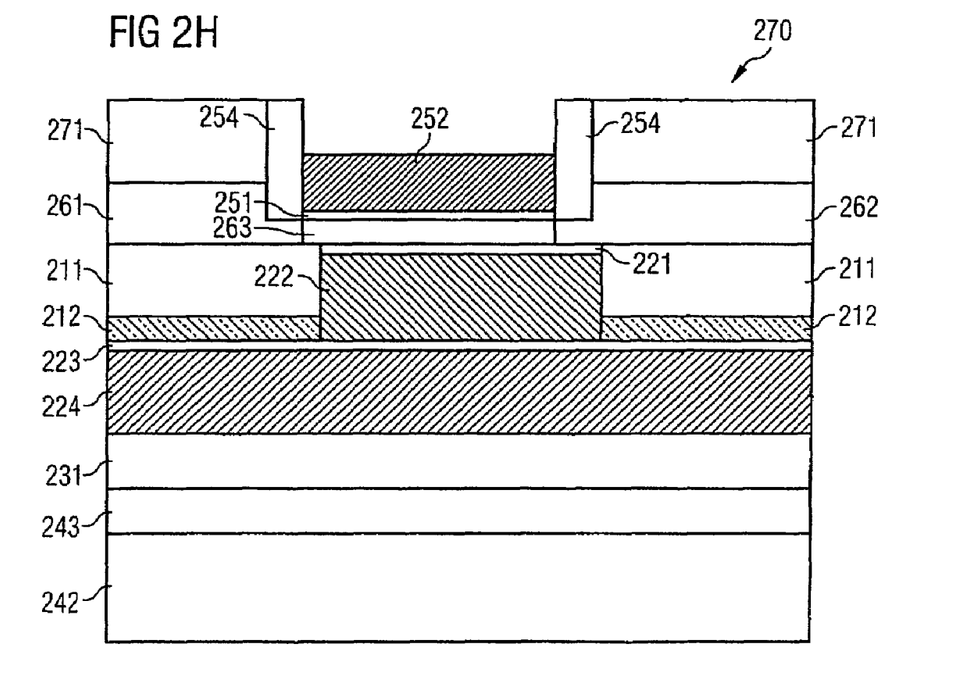

In order to obtain the layer sequence 270 shown in FIG. 2H, silicon dioxide material is deposited on the surface of the layer sequence 260. In a further method step, surface material of the layer sequence thus obtained is removed using a CMP method, the surface of the silicon nitride covering layer 253 serving as a stop layer during the CMP method. In a further method step, the silicon nitride covering layer 253 is removed using a wet-chemical etching method, thereby obtaining the layer sequence 270 with a lateral silicon dioxide structure 271 as shown in FIG. 2H.

Figure 2I:
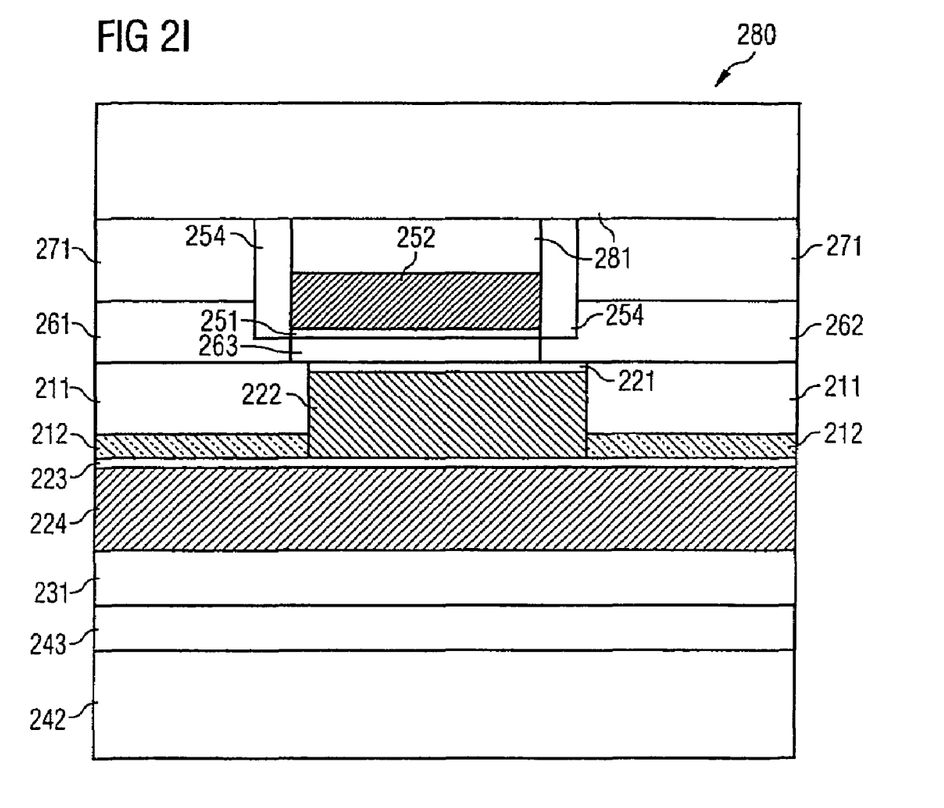

In order to obtain the memory cell 280 in accordance with a preferred exemplary embodiment of the invention as shown in FIG. 2I, tungsten silicide material is deposited. This material is then patterned using a lithography and an etching method to form a read line 281. Furthermore, it is possible to cover intermediate regions in the surface of the memory cell 280 with silicon dioxide material and to planarize the layer sequence thus obtained using a CMP method.

In a back end of the line processing, using a lithography and an etching method, a contact hole is etched into the silicon dioxide covering layer and this contact hole is filled with an electrically conductive material in order to make contact with the tungsten read line 281 externally.

The process sequence described involves carrying out the high-temperature processes such as the formation of the silicon dioxide gate insulating layer 221 made of silicon dioxide or the formation of the ONO layer sequence 223 or in the SOI wafer 200. At the time of forming the second gate insulating layer 251 made of the high-k dielectric aluminum oxide, afterward it is no longer necessary to carry out any further high-temperature processes, so that the temperature-sensitive high-k dielectric is protected against damage by subsequent high-temperature influences. Consequently, a modular process sequence of flash cell and logic is made possible.

It should be noted that the thickness of the ONO layer 223 and also the thickness of the first gate insulating layer 221 are chosen to be large enough to enable a secure electrical decoupling of the floating gate 222 from its surroundings. The thickness of these layers should preferably be at least 6 nm to 8 nm. In order, on the other hand, to enable a good controllability of the conductivity of the channel 203 of the double gate transistor shown, the thickness of the second gate insulating layer 251 that is preferably produced from a high-k material should be smaller than the thickness of the layers 223 and 221, respectively.

The functionality of the memory cell 280 shown in FIG. 2I is described below.

In order to write an item of information to the memory cell 280, a sufficiently strong electrical voltage is applied to the memory gate electrode 224, so that electrons tunnel between the memory gate electrode 224 and the floating gate 222 by means of Fowler-Nordheim tunneling. A net electrical charge remains on the floating gate since uncompensated electrical charge carriers generated by means of Fowler-Nordheim tunneling are protected against clearing away from the floating gate 222 on account of the electrically insulating layers 211, 212, 221, 223 surrounding the floating gate. The information of the memory cell 280 is contained in the sign and/or in the magnitude of the net charge on the floating gate.

The information can be erased by bringing about a tunneling current of charge carriers between the layer 224 and the floating gate 222 by means of applying a sufficiently high electrical voltage with a sign opposite to the sign chosen during programming to the memory gate electrode 224.

If electrical charge carriers are contained in the floating gate 222, then the conductivity of the channel region 263 is characteristically influenced thereby. In order to read out an item of stored information, a read voltage is additionally applied to the read electrode 252, and a further small electrical voltage is applied between the two source/drain terminals 261, 262. The value of the current flow between the source/drain terminals 261, 262 is characteristically influenced by electrical charge carriers possibly contained in the floating gate 222, so that the stored information can thereby be read out.

A detailed description is given below, with reference to table 1, of the storing, erasing and reading of information in the memory cell 280.

As can be gathered from table 1, in order to erase information in the memory cell 280, a voltage of 5 volts is applied to the first source/drain terminal 261, and a voltage of 5 volts is applied to the second source/drain terminal 262. A voltage of −10 volts is applied to the memory gate electrode 224 and the read electrode 252 is "floating".

TABLE 1

| Operating state | First source/drain terminal | Second source/drain terminal | Memory gate electrode | Read electrode |
| --- | --- | --- | --- | --- |
| Erasure | 5 V | 5 V | −10 V | "floating" |
| Storage | 0 | 0 | 15 V | "floating" |
| Reading | 0 | 1 V | "floating" | 1.5 V |

In order to store information, the two source/drain terminals 261, 262 are brought to a voltage of 0 volts, the read electrode 252 is floating, and a voltage of 15 volts is applied to the memory gate electrode 224.

In order to read out information from the memory cell 280, a voltage of 0 volts is applied to the first source/drain terminal 261, the second source/drain terminal 262 is brought to a voltage of 1 volt. The memory gate electrode 224 is floating, and a voltage of 1.5 volts is applied to the read electrode 252.

Figure 3A:
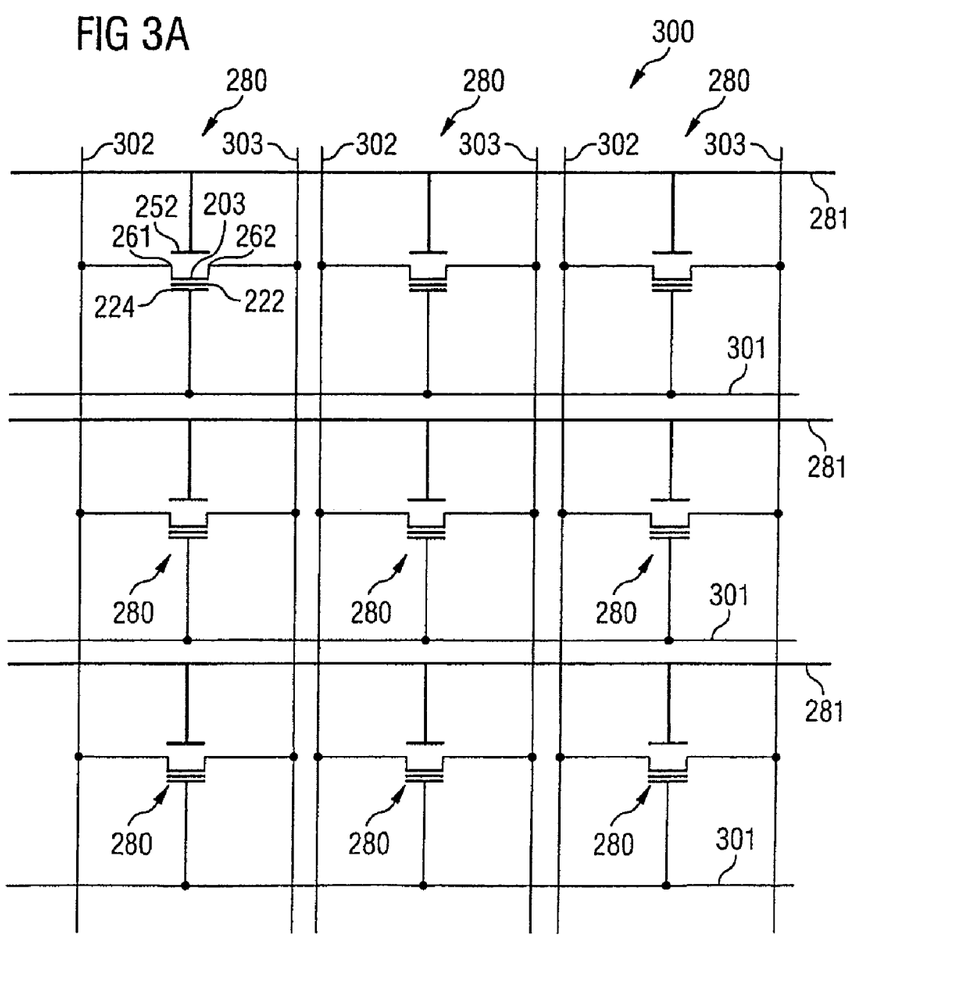
FIG. 3A shows a memory cell arrangement corresponding to an AND logic combination in accordance with a first exemplary embodiment of the invention.

A description is given below, with reference to FIG. 3A, of a memory cell arrangement 300 in accordance with a first preferred exemplary embodiment of the invention.

The memory cell arrangement 300 has a multiplicity of memory cells 280 like the one shown in FIG. 2I which are arranged essentially in matrix form. Identical or corresponding elements in FIG. 3A are provided with the same reference numerals as in FIG. 2I.

The memory cell arrangement 300 is embodied in AND logic combination.

The memory cell arrangement 300 has a multiplicity of tungsten read lines 281 which are essentially arranged parallel to one another and each of which is coupled to read electrodes 252 of a respective row of memory cells 280. The tungsten read lines 281 coupled to the read electrodes 252 are formed essentially parallel to memory gate lines 301 coupled to the memory gate electrodes 224. Furthermore, first sense lines 302 and second sense lines 303 are provided, which are formed in a manner essentially running orthogonally with respect to the lines 281, 301. Each first sense line 302 is coupled to the first source/drain terminals 261 of the memory cells 280 of a column of memory cells, whereas each second sense line 303 is coupled to the second source/drain terminals of a respective column of memory cells 280.

A description is given below, with reference to FIG. 3B, of a memory cell arrangement 320 in accordance with a second preferred exemplary embodiment of the invention.

The memory cell arrangement 320 is formed in NAND logic combination, whereas the memory cell arrangement 300 is formed in AND logic combination. The production method of the memory cell 280 as described with reference to FIG. 2A to FIG. 2I is tailored to a memory cell arrangement 300 in AND structure. A simple adaptation of the production method to the NAND logic combination from FIG. 3B is nevertheless possible. Identical or similar components of the memory cell arrangement 320 which are also contained in the memory cell arrangement 300 are provided with the same reference numerals.

In the case of the memory cell arrangement 320 in NAND logic combination, the tungsten read lines 281 are arranged in a manner running parallel to the memory gate lines 301. The memory cells 321 formed as double gate transistor memory cells are controlled by means of the read electrode 252 on one side of their channel region and are controlled by means of the memory gate electrode 224 on the other side of their channel region. A common tungsten read line 281 is provided for each column of memory cells 321, and a common memory gate line 301 is provided for each column of memory cells 321. A common sense line is in each case provided for each row of memory cells 321. Along a row of memory cells 321, the second source/drain terminal 262 of a first memory cell is in each case coupled via a component of the sense line 322 to the first source/drain terminal 261 of an adjacent second memory cell 321.

TABLE 2

| Mode | First source/drain terminal | Second source/drain terminal | Memory gate electrode | Read electrode |
| --- | --- | --- | --- | --- |
| Erasure | 5 V | 5 V | −12 V | "floating" |
| Storage | 0 | 0 | 15 V | "floating" |
| Reading | 0 | 1 V | 2.5 V | 1.0 V |

Figure 3B:
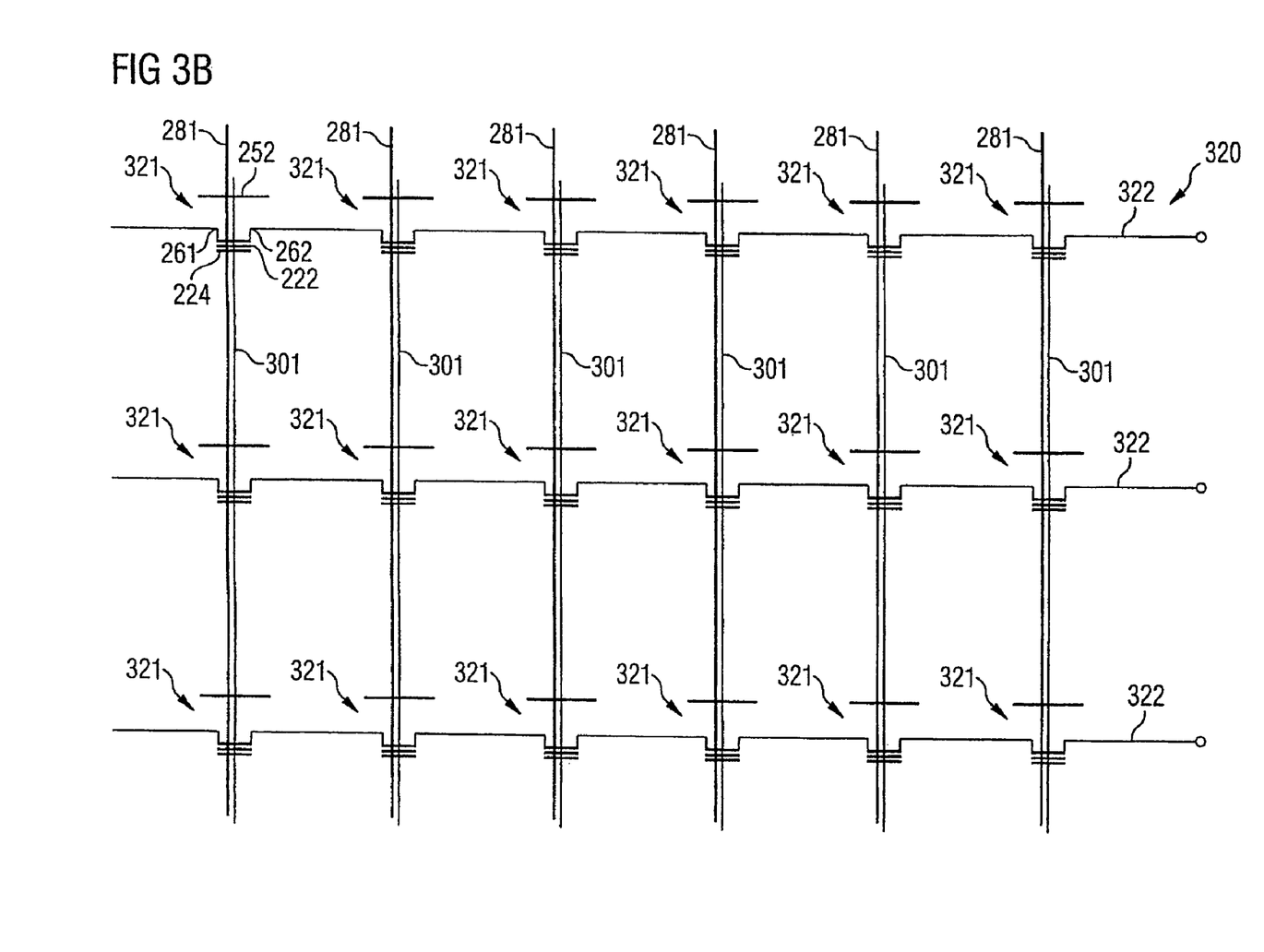
FIG. 3B shows a memory cell arrangement corresponding to a NAND logic combination in accordance with a second preferred exemplary embodiment of the invention.

Table 2 specifies values for the electrical voltages (or electrical potentials) to which the terminals shown in FIG. 3B are brought in accordance with the exemplary embodiment described in order to store information in a memory cell 321, to read the information or to erase the information.

What is claimed is:

1. A method for producing a memory cell, comprising the steps of:

forming a first gate insulating layer on a silicon-on-insulator substrate as an auxiliary substrate;

forming a floating gate on the first gate insulating layer;

forming an electrically insulating layer on the floating gate;

forming a memory gate electrode on the electrically insulating layer;

fixing a substrate to the memory gate electrode;

partly removing the auxiliary substrate;

forming a second gate insulating layer on a part of an uncovered surface of the auxiliary substrate;

forming a read gate electrode on the second gate insulating layer;

forming, essentially in an uncovered surface region of the remaining material of the auxiliary substrate, two source/drain regions; and forming a channel region between the two source/drain regions, wherein the channel region at least partly laterally overlaps the floating gate and the read gate electrode.

2. The method as claimed in claim 1, wherein the substrate is fixed to the memory gate electrode of the auxiliary substrate by means of wafer bonding.

3. The method as claimed in claim 1, further comprising the step of, chronologically before the step of fixing the substrate to the memory gate electrode, forming another electrically insulating layer between the memory gate electrode and the substrate.

4. The method as claimed in claim 3, wherein the electrically insulating layer and the other electrically insulating layer are produced from the same material.

5. The method as claimed in claim 1, further comprising the step of, chronologically after the step of forming the memory cell, forming a logic circuit.

6. The method as claimed in claim 1, wherein silicon material fully depleted of charge carriers is used as the channel region.

7. The method as claimed in claim 1, wherein the thickness of the first gate insulating layer is made greater than the thickness of the second gate insulating layer.

8. A memory cell comprising:
a silicon-on-insulator substrate as an auxiliary substrate, on which a first gate insulating layer is formed;
a floating gate formed on the first gate insulating layer;
an electrically insulating layer formed on the floating gate;
a memory gate electrode formed on the electrically insulating layer;
a substrate, which is fixed to the memory gate electrode;
a second gate insulating layer formed on a part of a surface of the auxiliary substrate, which surface is uncovered by means of partial removal of the auxiliary substrate;
a read gate electrode formed on the second gate insulating layer;
two source/drain regions located essentially in a surface region which is uncovered by the second gate insulating layer and the read gate electrode of the remaining material of the auxiliary substrate; and
a channel region located between the two source/drain regions, wherein the channel region at least partly laterally overlaps the floating gate and the read gate electrode.

9. The memory cell as claimed in claim 8, wherein the substrate is fixed to the layers arranged thereabove by means of wafer bonding.

10. The memory cell as claimed in claim 8, wherein the memory gate electrode and the read gate electrode are parallel to one another.

11. The memory cell as claimed in claim 8, wherein the source/drain regions are formed at least partly topologically right into the plane of the read gate electrode.

12. The memory cell as claimed in claim 8, wherein the second gate insulating layer is produced from a high-k material.

13. The memory cell as claimed in claim 12, wherein the second gate insulating layer is produced from one or a combination of materials selected from the group consisting of aluminum oxide, silicon nitride, zirconium oxide, hafnium oxide, yttrium oxide, and lanthanum oxide.

14. The memory cell as claimed in claim 8, wherein the read gate electrode is produced from a metallically conductive material.

15. The memory cell as claimed in claim 14, wherein the read gate electrode is produced from one or a combination of materials selected from the group consisting of tungsten, titanium, titanium nitride, tantalum nitride, copper, and aluminum.

16. The memory cell as claimed in claim 8, wherein the electrically insulating layer is an ONO layer sequence.

17. A memory cell arrangement comprising a plurality of memory cells as claimed in claim 8 formed in and/or on the substrate.

18. The memory cell arrangement as claimed in claim 17, connected up in AND logic combination or in NAND logic combination.

* * * * *

UNITED STATES PATENT AND TRADEMARK OFFICE
CERTIFICATE OF CORRECTION

| | |
|---|---|
| PATENT NO. | : 7,195,978 B2 |
| APPLICATION NO. | : 10/999810 |
| DATED | : March 27, 2007 |
| INVENTOR(S) | : Franz Hofmann et al. |

It is certified that error appears in the above-identified patent and that said Letters Patent is hereby corrected as shown below:

Column 3, lines 23-24, " mechanically" should read --mechanically sufficiently good robustness.--.

Signed and Sealed this

Fifteenth Day of May, 2007

JON W. DUDAS
*Director of the United States Patent and Trademark Office*